United States Patent
Oh et al.

[19]

[11] Patent Number: 5,949,100
[45] Date of Patent: Sep. 7, 1999

[54] INTEGRATE CIRCUIT DEVICE INCLUDING EXPANDED CONTACT HOLES AND RELATED STRUCTURES

[75] Inventors: Hee-Seon Oh, Suwon; Seung-Joon Cha, Seoul, both of Rep. of Korea

[73] Assignee: Samsung Electronics Co., Ltd., Rep. of Korea

[21] Appl. No.: 09/110,809

[22] Filed: Jul. 6, 1998

Related U.S. Application Data

[62] Division of application No. 08/963,794, Nov. 4, 1997.

[30] Foreign Application Priority Data

Nov. 6, 1996 [KR] Rep. of Korea ............... 96-52402

[51] Int. Cl.[6] .................. H01L 29/76; H01L 27/108; H01L 29/00
[52] U.S. Cl. .................. 257/296; 257/532; 257/295; 257/310
[58] Field of Search .................. 257/532–535, 257/296–310, 295; 438/243–253, 396–400

[56] References Cited

U.S. PATENT DOCUMENTS

| 4,918,503 | 4/1990 | Okuyama | 438/246 |
| 4,931,897 | 6/1990 | Tsukamoto et al. | 361/313 |
| 5,436,477 | 7/1995 | Hashizume et al. | 257/295 |
| 5,486,713 | 1/1996 | Koyama | 257/296 |
| 5,554,861 | 9/1996 | Mano et al. | 257/532 |
| 5,618,761 | 4/1997 | Eguchi et al. | 438/785 |
| 5,763,300 | 6/1990 | Park et al. | 438/240 |

FOREIGN PATENT DOCUMENTS

| 4032032614 | 9/1991 | Japan | 257/532 |
| 5-299582 | 11/1993 | Japan . | |

*Primary Examiner*—Minh Loan Tran
*Assistant Examiner*—Cuong Quang Nguyen
*Attorney, Agent, or Firm*—Myers Bigel Sibley & Sajovec

[57] ABSTRACT

A method of forming an integrated circuit device includes the steps of forming a first insulating layer on an integrated circuit substrate, forming a first capacitor electrode on the insulating layer opposite the substrate, and forming a second insulating layer on the first capacitor electrode and on the insulating layer opposite the substrate. A contact hole is formed in the second insulating layer thus exposing a surface of the first capacitor electrode. In particular, the contact hole exposes an edge portion of the first capacitor electrode and extends beyond the edge portion of the first capacitor electrode. A capacitor dielectric layer is formed on the exposed portion of the first capacitor electrode wherein the capacitor dielectric layer extends beyond the edge portion of the first capacitor electrode. A second capacitor electrode is formed on the dielectric layer wherein the second capacitor electrode extends beyond the edge portion of the first capacitor electrode. Related structures are also discussed.

20 Claims, 5 Drawing Sheets

INTEGRATE CIRCUIT DEVICE INCLUDING EXPANDED CONTACT HOLES AND RELATED STRUCTURES

This application is a divisional of prior application Ser. No. 08/963,794, filed Nov. 4, 1997.

FIELD OF THE INVENTION

The present invention relates to the field of integrated circuits and more particularly to capacitors for integrated circuit devices and related methods.

BACKGROUND OF THE INVENTION

There is currently demand for high speed, high capacitance capacitors for use in integrated circuit semiconductor devices. The speed of a capacitor can be increased by reducing the resistance of the capacitor electrodes thereby decreasing the frequency dependency thereof. The capacitance of a capacitor can be increased by reducing the thickness of the dielectric layer between the capacitor electrodes and/or increasing the dielectric constant of the dielectric layer. The capacitance of a capacitor can also be increased by increasing the surface area of the capacitor electrodes.

Integrated circuit capacitor structures include metal oxide semiconductor (MOS) capacitors, PN junction capacitors, polysilicon-insulatorpolysilicon (PIP) capacitors, metal-insulator-metal (MIM) capacitors. In MOS, PN, and PIP capacitors, single crystal silicon and/or polycrystalline silicon are used to provide at least one of the capacitor electrodes. The use of silicon as a capacitor electrode, however, may make significant reductions in electrode resistance difficult to obtain thus making higher speed capacitors difficult to obtain. Accordingly, thin film metal-insulator-metal (MIM) capacitors have been used to provide which speed capacitors because the MIM structure can provide relatively low resistance capacitor electrodes. Metal-insulator-metal capacitors are also frequently used in accurate analog semiconductor devices because MIM capacitors have a relatively low capacitance variation as well as desirable electrical characteristics over a broad range of voltages and temperatures.

In addition, multi-level wiring processes have been developed to provide high levels of integration in integrated circuit devices. Accordingly, the metal electrodes of a MIM capacitor can be formed during the formation of multiple wiring layers.

FIGS. 1A–1E are cross-sectional views illustrating steps of a method of making a thin film capacitor according to the prior art. As shown in FIG. 1A, a field oxide layer 12 defines active and isolation regions of the silicon substrate 10. A first insulating layer 14 is formed on the silicon substrate 10 and the field oxide layer 12. The insulating layer 14 insulates structures previously formed on the substrate 10 and selectively provides contact to these lower structures through contact holes. An aluminum layer is deposited on the first insulating layer 14 and photolithographically patterned to provide the lower capacitor electrode 16. Wiring structures can also be provided on the insulating layer 14 simultaneously with the steps of forming and patterning the lower capacitor electrode 16.

A second insulating layer 18 is formed on the lower capacitor electrode 16 and on the first insulating layer 14 as shown in FIG. 1B. The photoresist layer is deposited on the insulating layer 18 and exposed and developed to provide the photoresist mask 19 having the window 20 therein. The window 20 exposes a portion of the insulating layer 18 opposite the lower capacitor electrode 16.

The exposed portion of the insulating layer 18 is selectively etched using a dry etch step wherein the patterned photoresist mask 19 acts as an etch mask. A contact hole 21 is thus formed in the insulating layer 18, and the photoresist mask 19 is removed as shown in FIG. 1C. A surface portion of the lower capacitor electrode 16 is thus exposed through the contact hole 21.

An oxide layer is then grown on the exposed surface of the lower capacitor electrode 16 and on the exposed surfaces of the insulating layer 18 as shown in FIG. 1D. This oxide layer thus provides a capacitor dielectric layer 22 on the exposed portion of the lower capacitor electrode 16. If the lower capacitor electrode 16 is over etched during the dry etch step used to form the contact hole 21, however, the exposed surface of the lower capacitor electrode may become uneven as shown in FIG. 1D. In particular, uneven portions of the lower capacitor electrode 16 may not be completely covered by the capacitor dielectric layer 22 as indicated by reference number 23. Accordingly, a short circuit may result between the lower capacitor electrode 16 and an upper capacitor electrode formed on the capacitor dielectric layer 22. As shown in FIG. 1E, a metal layer is formed on the capacitor dielectric layer 22 and patterned to provide the upper capacitor electrode 24. Incomplete coverage of the exposed surface of the lower capacitor electrode 16 by the capacitor dielectric layer 22 may result in a short circuit between the two capacitor electrodes as indicated by reference numeral 23.

In other words, the step coverage of the capacitor dielectric layer 22 may not be sufficient to cover unevenness in the exposed surface of the lower capacitor electrode 16 resulting from an over etch during the step of forming the contact hole. In particular, the combination of the relatively steep sidewalls of the insulating layer 18 on the lower capacitor electrode 16 and the unevenness of the surface of the lower capacitor electrode 16 may make it difficult to cover the exposed surface of the lower capacitor electrode with a thin dielectric layer. The resulting risk of short circuiting between the upper and lower capacitor electrodes may reduce manufacturing yield and reliability of the capacitor structure.

Accordingly, thin film capacitors of the prior art have been fabricated with dielectric layers having thicknesses greater than 1,000 Angstroms. For example, delayed open Japanese Patent Application No. 5-299582 discusses the use of a dielectric oxide layer having a thickness of about 1,300 Angstroms. This dielectric thickness, however, may result in an undesirable reduction in the capacitance per unit area.

Accordingly, there continues to exist a need in the art for capacitor electrodes and structures which allow the fabrication of thin and reliable capacitor dielectric layers.

SUMMARY OF THE INVENTION

It is therefore an object of the present invention to provide improved methods of forming capacitors for integrated circuit devices and related structures.

It is another object of the present invention to provide methods of forming capacitors having increased reliability and related structures.

It is still another object of the present invention to provide methods of forming capacitors having increased capacitance and related structures.

It is still another object of the present invention to provide methods of forming capacitors having increased speed and related structures.

These and other objects are provided according to the present invention by methods including the steps of forming a first insulating layer on an integrated circuit substrate, and forming a first capacitor electrode on the insulating layer opposite the substrate. A second insulating layer is formed on the first capacitor electrode and on the first insulating layer opposite the substrate, and a contact hole is formed in the second insulating layer thus exposing a surface of the first capacitor electrode. More particularly, the contact hole exposes an edge portion of a first capacitor electrode and extends beyond an edge portion of the first capacitor electrode. A capacitor dielectric layer is formed on the exposed portion of the first capacitor electrode wherein the capacitor dielectric layer extends beyond the edge portion of the first capacitor electrode, and a second capacitor electrode is formed on the dielectric layer wherein the second capacitor electrode extends beyond the edge portion of the first capacitor electrode. Accordingly, the reliability of the capacitor dielectric layer is increased because the contact hole exposes an edge portion of the first capacitor electrode beyond which the dielectric layer extends. Because the contact hole is wider than the lower capacitor electrode, unevenness of the surface of the lower capacitor electrode can be reduced thus allowing the fabrication of a thin uniform dielectric layer.

Each of the first and second capacitor electrodes can be formed from metal layers, and a conductive protection layer such as a layer of titanium nitride can be formed on the lower capacitor electrode. This conductive protection layer can reduce the formation of hillocks on the capacitor electrodes. The step of forming the contact hole can include the steps of forming a photoresist mask on the second insulating layer and selectively etching portions of the second insulating layer exposed by the photoresist mask. In particular, the photoresist mask has a window therein opposite the first capacitor electrode, and the window exposes a surface area of the second insulating layer that is greater than the surface area of the first capacitor electrode so that a complete upper surface of the first capacitor electrode including edge portions thereof is exposed by the contact hole.

The dielectric layer preferably has a uniform thickness across the first capacitor electrode, and the thickness can be in the range of 500 Angstroms to 1,000 Angstroms. Moreover, the dielectric layer can be a silicon oxide layer formed by chemical vapor deposition, a silicon nitride layer formed by chemical vapor deposition, or a tantalum oxide layer formed by physical vapor deposition.

According to an alternate aspect of the present invention, an integrated circuit device includes a first insulating layer on an integrated circuit substrate, and a first capacitor electrode on the insulating layer. A second insulating layer is provided on the first capacitor electrode and on the first insulating layer wherein the second insulating layer has a contact hole therein exposing a surface of the first capacitor electrode. This contact hole has a surface area greater than a surface area of the first capacitor electrode so that an edge portion of the first capacitor electrode is exposed. A capacitor dielectric layer is provided on the exposed surface of the first capacitor electrode, and this capacitor dielectric layer has a uniform thickness and extends to the exposed edge portion of the first capacitor electrode. A second capacitor electrode is provided on the dielectric layer opposite the first capacitor electrode wherein the second capacitor electrode extends across the dielectric layer beyond the exposed edge portion of the first capacitor electrode.

According to the methods and structures of the present invention, a thin uniform dielectric layer can be provided on an integrated circuit capacitor thereby increasing the reliability, capacitance, and speed for the capacitor.

DETAILED DESCRIPTION

Figure 1A:
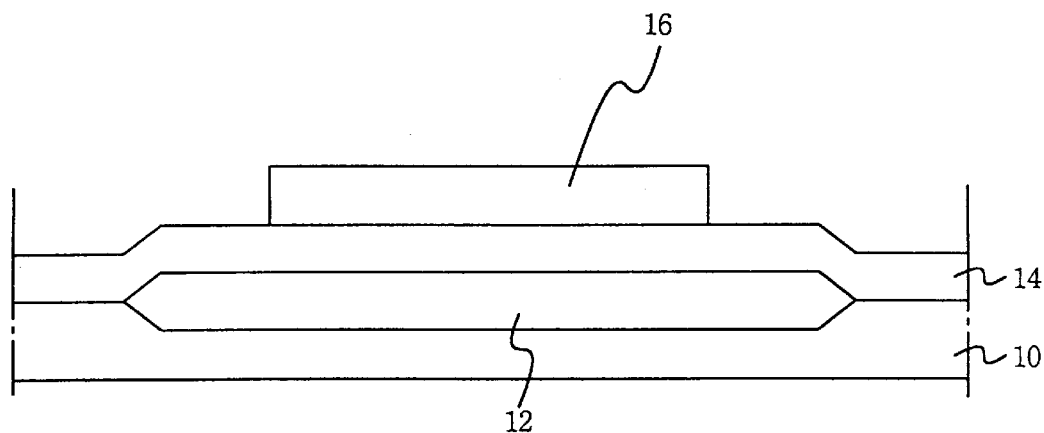
FIGS. 1A–1E are cross-sectional views illustrating steps of a method of making a thin film capacitor according to the prior art.
Figure 1B:
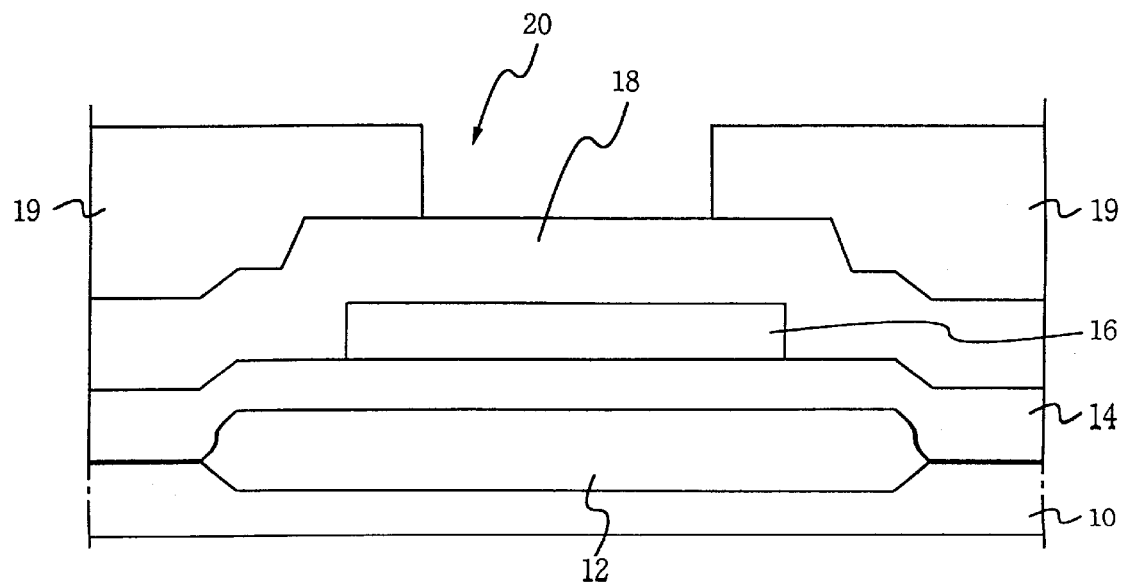
Figure 1C:
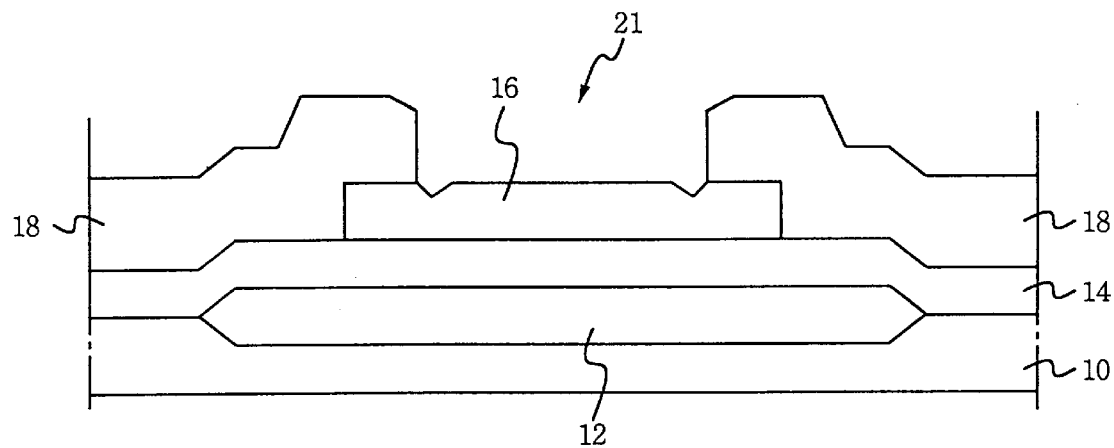
Figure 1D:
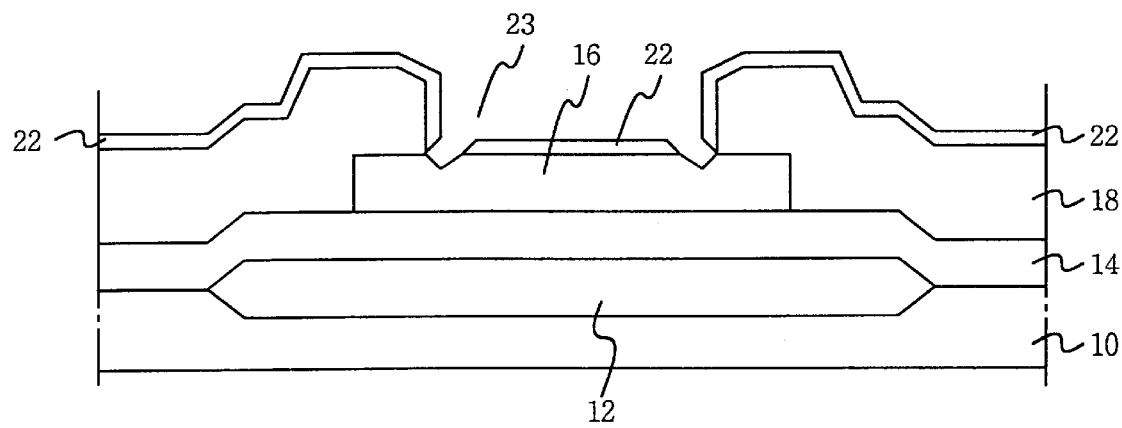
Figure 1E:
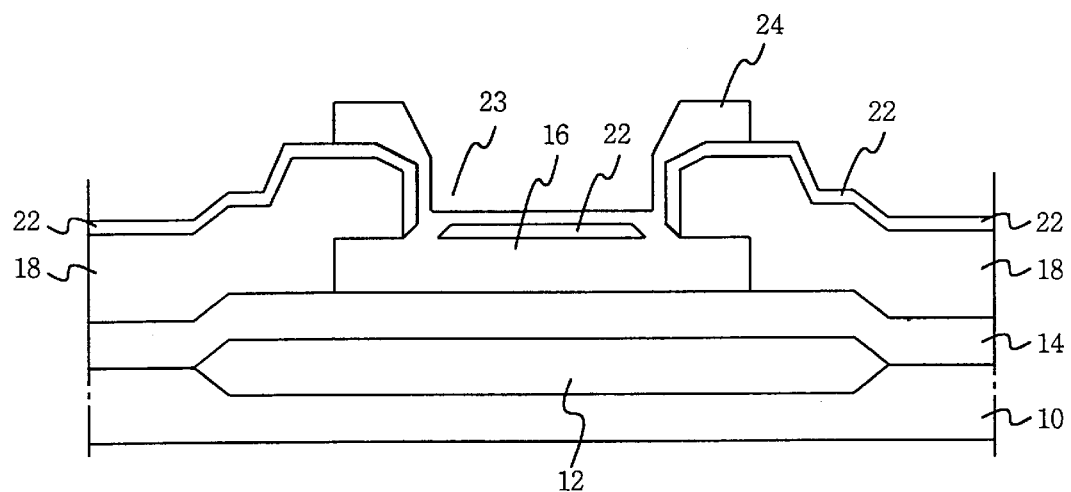
Figure 2A:
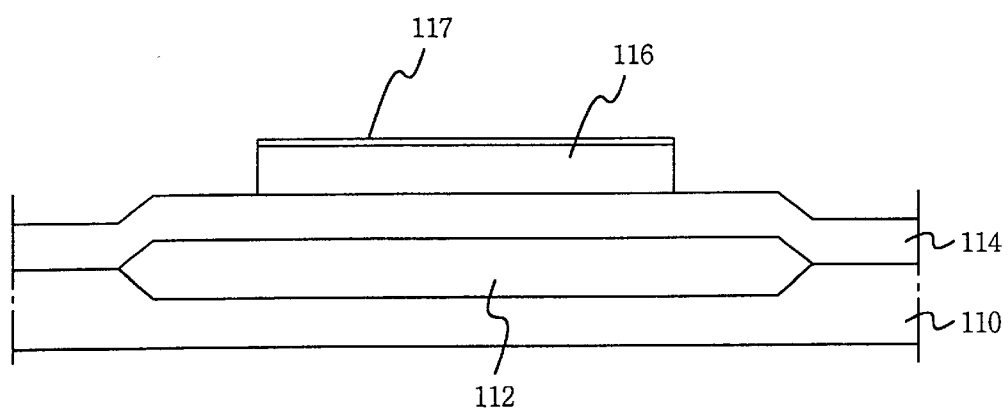
FIGS. 2A–2E are cross-sectional views illustrating steps of a method of making a thin film capacitor according to the present invention.

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout. It will also be understood that when a layer is referred to as being "on" another layer or substrate, it can be directly on the other layer or substrate, or intervening layers may also be present FIGS. 2A–2E are cross-sectional views illustrating steps of a method of forming a thin film capacitor according to the present invention. As shown in FIG. 2A, a field oxide layer 112 defines active and isolation regions of a semiconductor substrate 110. Moreover, integrated circuit devices such as transistors including sources, drains, and gates are formed on the active region of the substrate. A first insulating layer 114 is deposited on the field oxide layer 112 and the substrate 110. The insulating layer 114 can be a layer of an insulating material such as a high temperature oxide (HTO) or a boron-phosphor silicated glass (BPSG). The insulating layer 114 provides electrical insulation between conductive layers such as wiring layers formed thereon and the substrate 110.

A metal layer such as an aluminum layer, an aluminum alloy layer, a copper layer, or a copper alloy layer is formed on the insulating layer 114 opposite the substrate 110. This metal layer is then patterned using photolithographic mask and etch steps to provide the lower capacitor electrode 116 as shown in FIG. 2A. A conductive protection layer 117 can also be formed on the lower capacitor electrode 116. This conductive protection layer 117 can be a protective metal layer or a titanium nitride layer used to reduce the formation of aluminum hillocks on the upper surface of the lower capacitor electrode 116. Moreover, the insulating layer 114 can be patterned to provide contact holes therethrough thus exposing portions of structures formed on the substrate below. Metal wiring layers can thus be formed on the insulating layer 114 to provide interconnections through these contact holes, and these metal wiring layers can be formed simultaneously during the steps of forming the lower capacitor electrode 116.

Figure 2B:
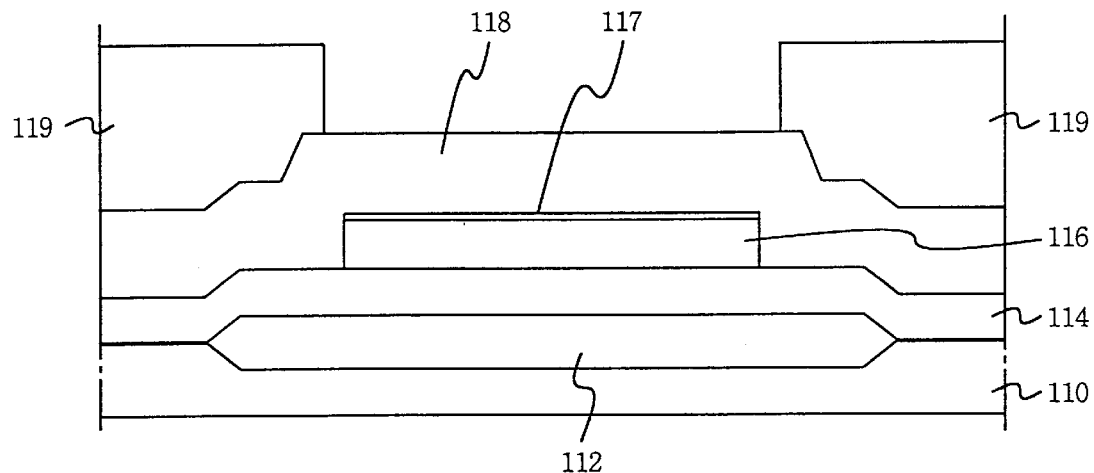
Figure 2C:
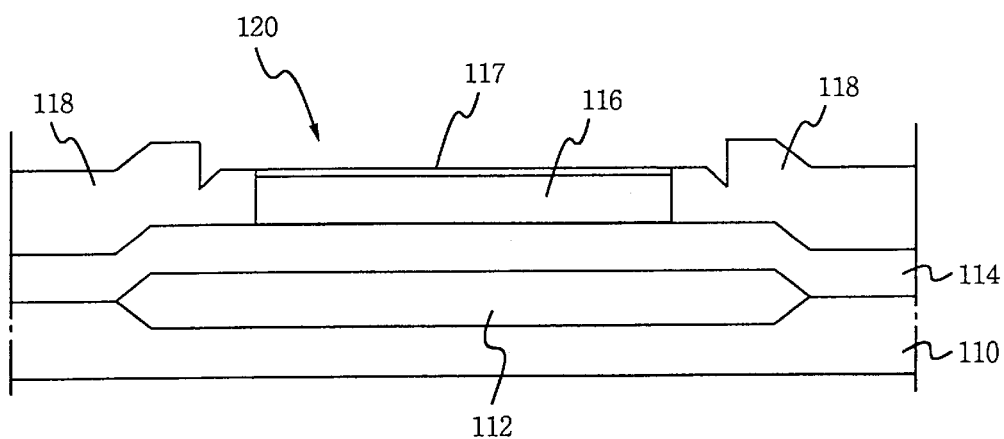

A second insulating layer 118 is then formed on the lower capacitor electrode 116 and the first insulating layer 114 as shown in FIG. 2B. This second insulating layer 118 can be a layer of an insulating material such as a low temperature oxide (LTO) or a phosphor-silicated glass (PSG). A photoresist layer is then formed and patterned on the second insulating layer 118 to provide a photoresist mask 119 having a window therein exposing a portion of the second insulating layer 118 opposite the lower capacitor electrode 116. In particular, the photoresist window exposes a surface area of the insulating layer 118 that is wider than a surface area of the lower capacitor electrode 116. The second insulating layer 118 is then selectively etched using the photoresist pattern 119 as an etch mask to form a contact hole 120 exposing the surface of the lower capacitor electrode 116 as shown in FIG. 2C. As shown, the contact hole 120 has a greater surface area than that of the surface of the lower capacitor electrode 116 so that edge portions of the lower capacitor electrode 116 are exposed. Because the sidewalls of the contact hole 120 are positioned outside the edges of the lower capacitor electrode 116, unevenness in the surface of the lower capacitor electrode 116 as a result of the etch can be reduced.

Figure 2D:
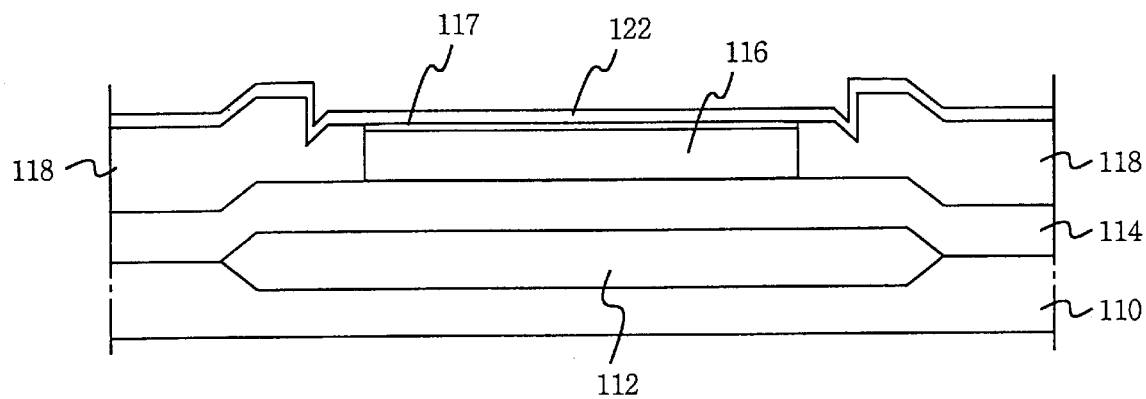

A capacitor dielectric layer 122 is then formed on the exposed surface of the lower capacitor electrode 116 as shown in FIG. 2D. More particularly, this capacitor dielectric layer 122 extends across the surface of the lower capacitor electrode 116 to the edges thereof and beyond. A uniform dielectric layer can thus be provided because the sidewalls of the contact hole 120 are not on the surface of the lower capacitor electrode 116. Moreover, the capacitor dielectric layer 122 can have a thickness in the range of 500 Angstroms to 1,000 Angstroms, and the dielectric layer can be a layer of silicon oxide ($SiO_2$) formed by chemical vapor deposition, silicon nitride (SiN) formed by chemical vapor deposition, or tantalum oxide ($Ta_2O_3$) formed by physical vapor deposition.

Figure 2E:
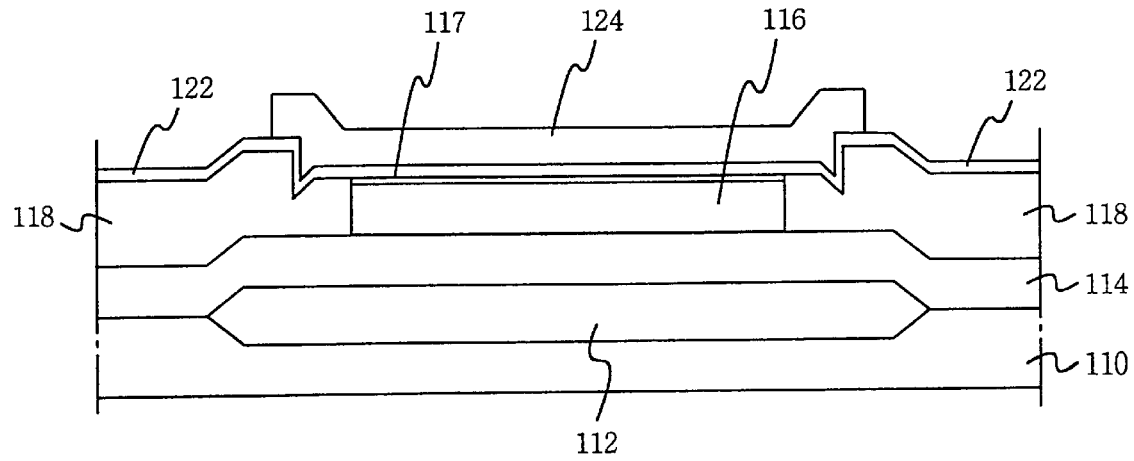

A metal layer is deposited on the capacitor dielectric layer 122 and photolithographically patterned using mask and etch steps to provide an upper capacitor electrode 124 as shown in FIG. 2E. The upper capacitor electrode can be formed from a layer of a metal such as aluminum or an aluminum alloy. As shown, the contact area between the dielectric layer 122 and the upper capacitor electrode 124 is wider than the contact area between the lower capacitor electrode 116 of the dielectric layer 122. Stated in other words, the upper capacitor electrode 124 extends across the dielectric layer 122 beyond the edge portions of the lower capacitor electrode 116. Because unevenness in the surface of the lower capacitor electrode 116 has been reduced, the likelihood of electrical shorts between the upper and lower capacitor electrodes is also reduced.

In addition, the dielectric layer 122 and the second insulating layer 118 can be patterned to provide contact holes therethrough before the step of forming the upper capacitor electrode. In particular, these contact holes can be used to expose portions of a first metal wiring layer on the first insulating layer 114, and a second wiring layer can be formed on the dielectric layer 122 making contact through the contact holes. In addition, the second electrode wiring layer can be formed simultaneously with the step of forming the upper capacitor electrode 124.

In addition, conductive protection layers can be formed before and/or after the step of forming the upper capacitor electrode 124. As before, these conductive protection layers can be protective metal layers or titanium nitride layers, and these conductive protection layers can be used to reduce the formation of hillocks on the surfaces of the upper capacitor electrode 124.

As discussed above, by forming a contact hole exposing the edge portions of the lower capacitor electrode, the sidewalls of the contact hole can be positioned outside the lower capacitor electrode surface thereby reducing defects in the surface of a capacitor dielectric layer formed on the lower capacitor electrode. In other words, the location of the contact hole sidewalls outside the surface of the lower capacitor electrode allows the formation of a thin uniform dielectric layer across the surface of the lower capacitor electrode. Accordingly, short circuits between the upper and lower capacitor electrodes through the dielectric layer can be reduced, and the capacitance can be increased.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device comprising:

an integrated circuit substrate;

a first insulating layer on said integrated circuit substrate;

a first capacitor electrode on said insulating layer;

a second insulating layer on said first capacitor electrode and on said first insulating layer wherein said second insulating layer has a contact hole therein exposing a surface of said first capacitor electrode and wherein said contact hold has a surface area greater than a surface area of said first capacitor electrode so that an edge portion of said first capacitor electrode is exposed;

a capacitor dielectric layer on said exposed surface of said first capacitor electrode wherein said capacitor dielectric layer has a uniform thickness and wherein said capacitor dielectric layer extends to said exposed edge portion of said first capacitor electrode; and a second capacitor electrode on said dielectric layer opposite said first capacitor electrode wherein said second capacitor electrode extends across said dielectric layer beyond said exposed edge portion of said first capacitor electrode.

2. An integrated circuit device according to claim 1 wherein a surface contact area between said second capacitor electrode and said dielectric layer is greater than a surface contact area between said first capacitor electrode and said dielectric layer.

3. An integrated circuit device according to claim 1 wherein said uniform thickness of said capacitor dielectric layer is in the range of 500 Angstroms to 1000 Angstroms.

4. An integrated circuit device according to claim 1 wherein said capacitor dielectric layer comprises silicon oxide ($SiO_2$).

5. An integrated circuit device according to claim 1 wherein said capacitor dielectric layer comprises silicon nitride (SiN).

6. An integrated circuit device according to claim 1 wherein said capacitor dielectric layer comprises tantalum oxide ($Ta_2O_3$).

7. An integrated circuit device according to claim 1 wherein said first and second capacitor electrodes each comprise metal layers.

8. An integrated circuit device according to claim 1 further comprising a conductive protection layer on said first capacitor electrode adjacent said capacitor dielectric layer and opposite said substrate.

9. An integrated circuit device according to claim 8 wherein said conductive protection layer comprises titanium nitride.

10. An integrated circuit device according to claim 1 wherein said contact hole has a sidewall spaced apart from said exposed edge portion of said first capacitor electrode.

11. An integrated circuit device comprising:

an integrated circuit substrate;

a first insulating layer on said integrated circuit substrate;

a first capacitor electrode on said insulating layer;

a second insulating layer on said first capacitor electrode and on said first insulating layer wherein said second insulating layer has a contact hole therein exposing a surface of said first capacitor electrode and wherein said contact hole has a sidewall spaced apart from an edge portion of said first capacitor electrode so that said edge portion of said first capacitor electrode is exposed;

a capacitor dielectric layer on said exposed surface of said first capacitor electrode wherein said capacitor dielectric layer has a uniform thickness and wherein said capacitor dielectric layer extends to said exposed edge portion of said first capacitor electrode; and a second capacitor electrode on said dielectric layer opposite said first capacitor electrode wherein said second capacitor electrode extends across said dielectric layer beyond said exposed edge portion of said first capacitor electrode.

12. An integrated circuit device according to claim 11 wherein a surface contact area between said second capacitor electrode and said dielectric layer is greater than a surface contact area between said first capacitor electrode and said dielectric layer.

13. An integrated circuit device according to claim 11 wherein said uniform thickness of said capacitor dielectric layer is in the range of 500 Angstroms to 1000 Angstroms.

14. An integrated circuit device according to claim 11 wherein said capacitor dielectric layer comprises silicon oxide ($SiO_2$).

15. An integrated circuit device according to claim 11 wherein said capacitor dielectric layer comprises silicon nitride (SiN).

16. An integrated circuit device according to claim 11 wherein said capacitor dielectric layer comprises tantalum oxide ($Ta_2O_3$).

17. An integrated circuit device according to claim 11 wherein said first and second capacitor electrodes each comprise metal layers.

18. An integrated circuit device according to claim 11 further comprising a conductive protection layer on said first capacitor electrode adjacent said capacitor dielectric layer and opposite said substrate.

19. An integrated circuit device according to claim 18 wherein said conductive protection layer comprises titanium nitride.

20. An integrated circuit device according to claim 11 wherein said contact hole has a surface area greater than a surface area of said first capacitor electrode.

* * * * *

UNITED STATES PATENT AND TRADEMARK OFFICE
CERTIFICATE OF CORRECTION

PATENT NO. : 5,949,100
DATED : September 7, 1999
INVENTOR(S) : Oh et al.

It is certified that error appears in the above-identified patent and that said Letters Patent is hereby corrected as shown below:

on the title page:

In the title of the invention, delete "INTEGRATE" and insert -- INTEGRATED --; delete "DEVICE" and insert -- DEVICES --; and delete "AND RELATED STRUCTURES".

In the Claims:

Column 6, line 24, delete "hold" and insert -- hole --.

Signed and Sealed this

Twenty-sixth Day of September, 2000

Q. TODD DICKINSON

Attest:

*Attesting Officer*       *Director of Patents and Trademarks*